United States Patent
Cho et al.

(10) Patent No.: US 6,266,286 B1
(45) Date of Patent: Jul. 24, 2001

(54) WAFER BURN-IN TEST CIRCUIT AND METHOD FOR TESTING A SEMICONDUCTOR MEMORY DEVICE

(75) Inventors: Soo-In Cho, Seoul; Jong-Hyun Choi, Suwon, both of (KR)

(73) Assignee: Samsung Electronics Co., Ltd., Kyungi-do (KR)

( * ) Notice: Subject to any disclaimer, the term of this patent is extended or adjusted under 35 U.S.C. 154(b) by 0 days.

(21) Appl. No.: 09/457,909

(22) Filed: Dec. 8, 1999

Related U.S. Application Data

(63) Continuation of application No. 08/935,613, filed on Sep. 23, 1997, now Pat. No. 6,026,038.

(30) Foreign Application Priority Data

Sep. 23, 1996 (KR) .................................................. 96 41714

(51) Int. Cl.[7] ........................................................ G11C 7/00
(52) U.S. Cl. ............................ 365/201; 365/210; 365/202
(58) Field of Search ............................................... 365/201, 210, 365/230.06, 202

(56) References Cited

U.S. PATENT DOCUMENTS

| | | | |
|---|---|---|---|
| 5,265,057 | 11/1993 | Furuyama et al. | 365/201 |
| 5,555,212 | 9/1996 | Toshiaki et al. | 365/201 |
| 5,590,079 | 12/1996 | Lee et al. | 365/201 |
| 5,621,348 | 4/1997 | Furutani et al. | 589/327 |
| 5,638,331 | 6/1997 | Cha et al. | 365/201 |
| 5,726,939 | * 3/1998 | Cho et al. | 365/201 |
| 5,757,228 | 5/1998 | Furutani et al. | 589/327 |
| 5,790,465 | * 8/1998 | Roh et al. | 365/201 |
| 5,796,287 | 8/1998 | Furutani et al. | 374/327 |
| 6,005,815 | * 12/1999 | Nakano | 365/201 |

FOREIGN PATENT DOCUMENTS

| | | |
|---|---|---|
| 43 45 246 C 2 | 5/1994 | (DE) . |
| 93109368 | 12/1993 | (EP) . |
| 93115586 | 4/1994 | (EP) . |
| 9504777 | 9/1995 | (GB) . |

OTHER PUBLICATIONS

"Printout From Dialog Database".

* cited by examiner

*Primary Examiner*—Richard Elms
*Assistant Examiner*—VanThu Nguyen
(74) *Attorney, Agent, or Firm*—Marger Johnson & McCollom, P.C.

(57) ABSTRACT

A wafer burn-in test circuit of a semiconductor memory device having a plurality of memory cells arranged in a row/column matrix, is provided, including: a sub word line driver connected to first and second word line groups each connected to true cells and complement cells forming the memory cells, and responding to a predecoded low address; and first and second power lines respectively supplying power to the corresponding first and second power line groups by a switching operation of the sub word line driver, wherein a ground power source is applied to the first and second power lines during a normal operation, and the ground power source and a step-up power source are alternately applied to the first and second power lines during a wafer burn-in test operation.

10 Claims, 4 Drawing Sheets

WAFER BURN-IN TEST CIRCUIT AND METHOD FOR TESTING A SEMICONDUCTOR MEMORY DEVICE

This application is a continuation of prior application Ser. No. 08/935,613 filed Sep. 23, 1997 (now U.S. Pat. No. 6,026,038 issued on Feb. 15, 2000).

BACKGROUND OF THE INVENTION

1. Field of the Invention

The present invention relates to a wafer test circuit for a semiconductor memory device and, more particularly, to a wafer burn-in test circuit and a method of testing a semiconductor memory device which tests for defects in the semiconductor device by applying a stress voltage which exceeds the normal operating voltage of the device.

2. Description of the Related Art

Manufacturers of semiconductor memory devices usually perform a burn-in test to test for memory cell defects after manufacturing is substantially complete. The burn-in test is typically performed after the chip is packaged. Therefore, if it is determined in the final burn-in test step that there is a defect in the wafer, the failed portion of the wafer is discarded, even though the manufacture of the product is substantially complete. The test method is therefore inefficient.

It would be desirable to perform the wafer burn-in test earlier in the manufacturing process. A scheme is exemplified to perform the burn-in test in the wafer fabrication step. Specifically, in case of a dynamic random access memory (DRAM), most of burn-in failures are the single bit failure, the testing for which requires much time. A single bit failure is directly related to a leakage of an incomplete memory cell. The current leakage results from defects in the transmission gate oxide, capacitor dielectric and memory node junction. A conventional wafer burn-in (WBI) testing circuit is realized differently depending upon the word line structure of the memory device. In addition, each node stress is also variable according to the WBI operation. Exact screening is therefore not possible.

FIG. 1 illustrates a WBI structure applicable to a memory cell array structure of a subword-line driver.

A row decoder (not shown) provides decoded addresses ψPRE1 and ψPRE2 to the subword-line driver of FIG. 1 in a normal operating mode to thereby drive a word line WL and thus select an intended cell. The word line driver is made up of transistors 101 through 103, inverter 104 and transistors 105, 106. The operation of the subword-line driver of FIG. 1 is described first during normal operation and then during a wafer burn-in test performed by the manufacturer.

A wafer burn-in enable signal WBI is a low level signal during normal operation. A row predecoding signal ψPRE1 is also low. A low predecoding signal/ψPRE2 is an inverted signal of the predecoding signal ψPRE2. To place the circuit in the wafer burn-in test mode, the wafer burn-in enable signal WBI is set to a high level thereby turning on the transistor 105. A word line stress voltage Vstress is applied through the path for discharging the word line WL, so that the stress affects the memory cell. This kind of circuit operation screens for oxidation defects of the transmission transistor due to the word line stress, but cannot apply a bit line stress because all of the word lines are enabled and the same data is therefore written into the cell connected to the corresponding word line. The same voltage is therefore applied between the bit lines and defective cells, which might be affected by a large stress potential, are not destroyed and thus not detected during testing.

SUMMARY OF THE INVENTION

The present invention comprises a wafer burn-in test circuit and testing method for a semiconductor memory device having a plurality of storage cells arranged in a matrix of rows and columns. A first word line is connected to a plurality of storage cells and a second word line is connected to a plurality of storage cells different from those connected to the first word line. First and second power lines respectively supply power to the corresponding first and second word lines responsive to signals generated by an address decoder in the memory device. A ground potential is applied to the power lines during an operation mode and a stress voltage and a ground potential are alternately supplied to the first and second power lines during a test mode.

An object of the invention is to provide a wafer burn-in test circuit and method in which defects are discovered early in the manufacturing process.

Another object of the invention is to provide a wafer burn-in test circuit and method capable of stressing a bit line as well as a word line.

Yet another object of the invention is to provide a wafer burn-in test circuit which reduces the production expense of a memory chip.

DETAILED DESCRIPTION OF THE PREFERRED EMBODIMENT

Figure 1:
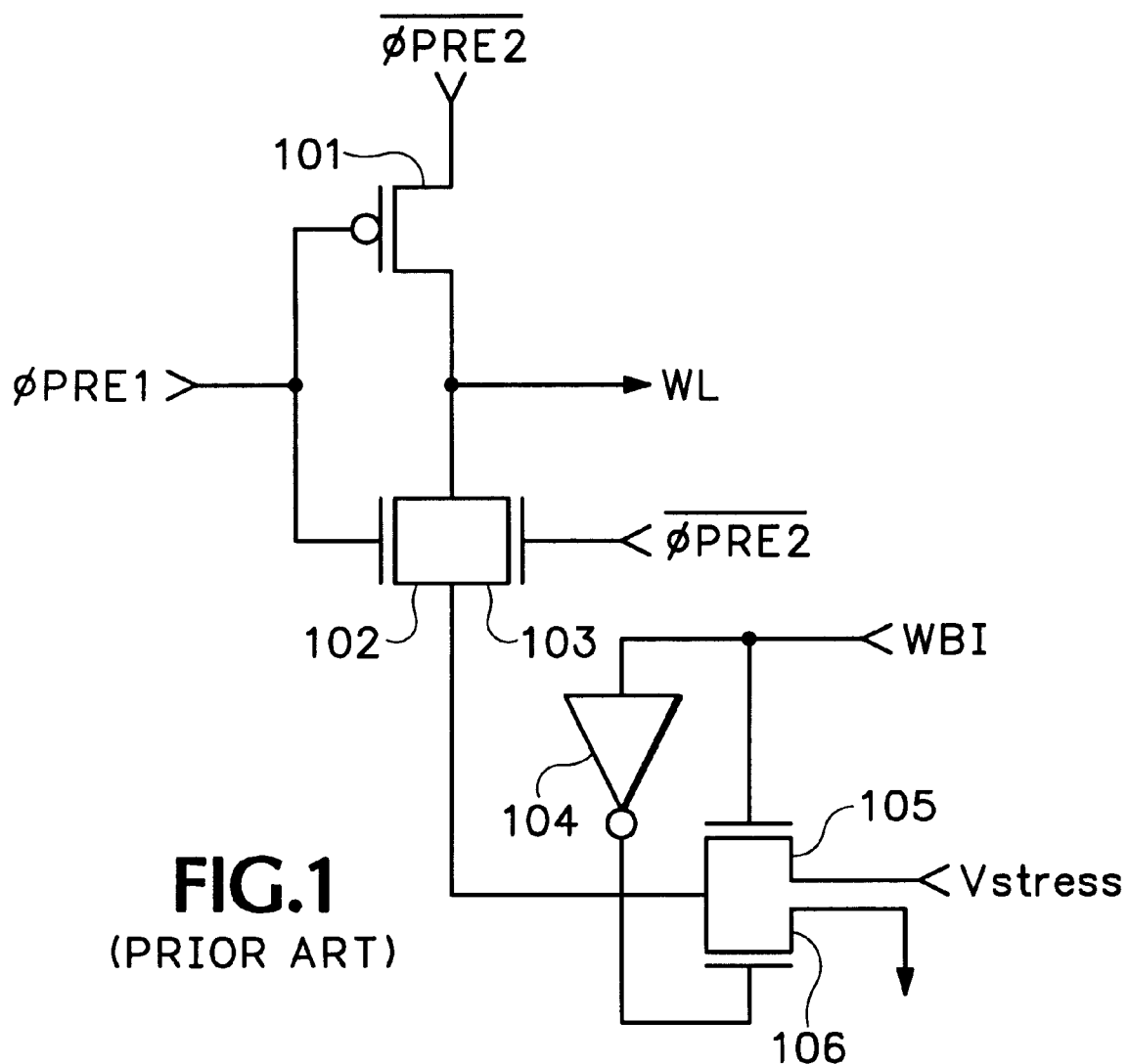
FIG. 1 illustrates the structure of a conventional wafer burn-in test circuit.

With reference to the attached drawings, preferred embodiments of the invention will be described below. Similar reference numerals denote similar structure throughout the specification and drawings.

Figure 2:
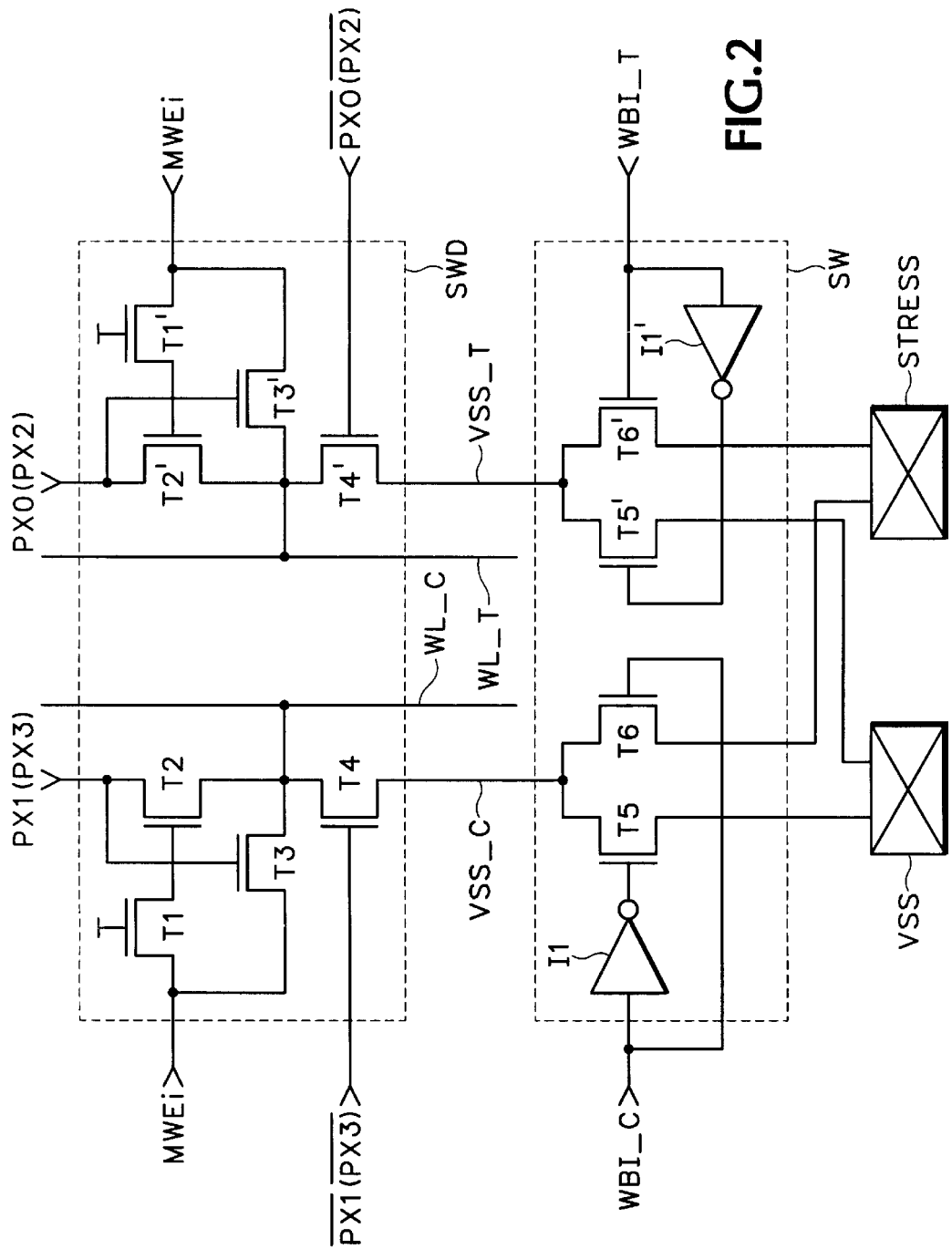
FIG. 2 illustrates the structure of a wafer burn-in test circuit constructed in accordance with the invention.
Figure 3:
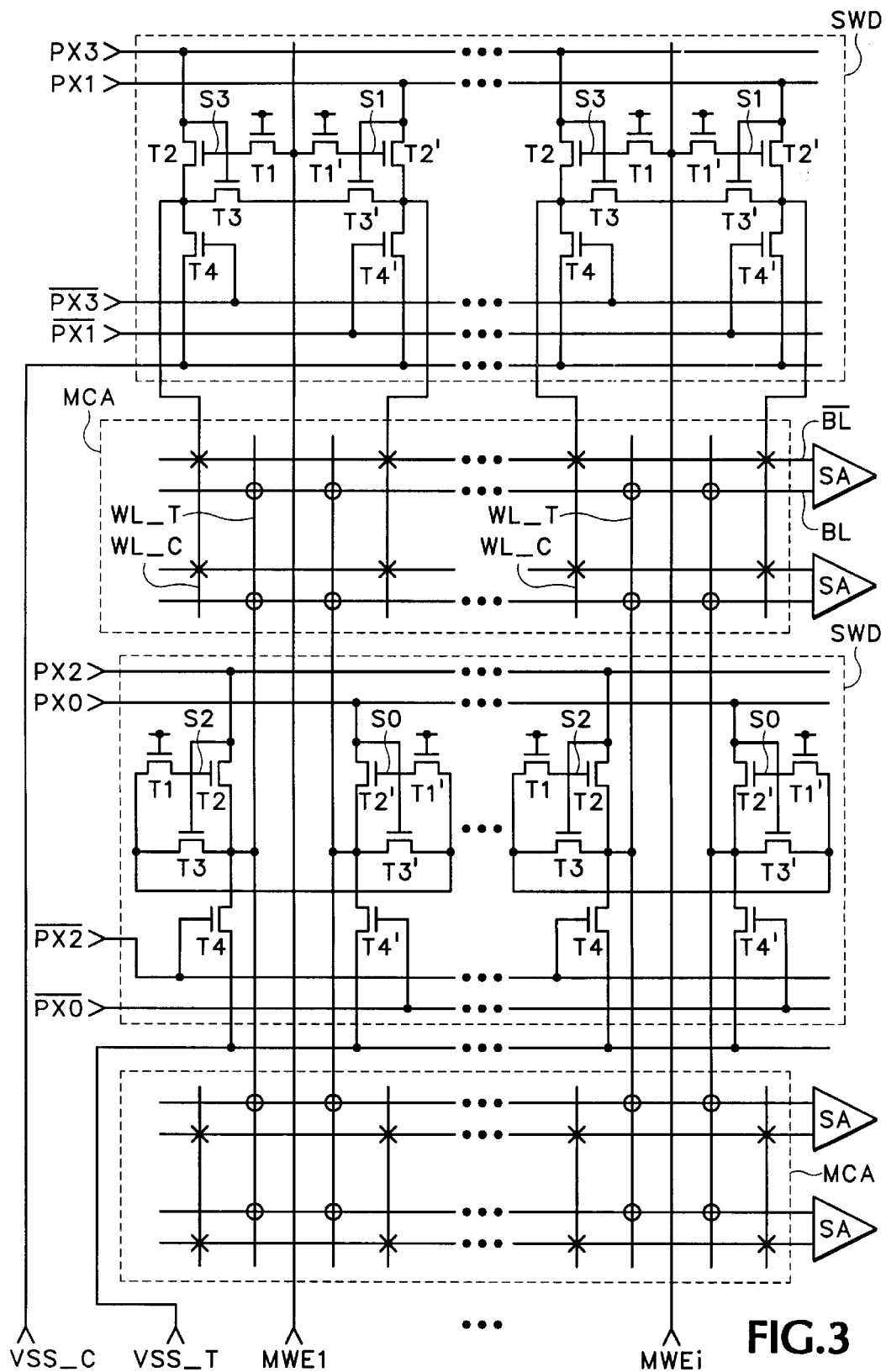
FIG. 3 illustrates a wafer burn-in test circuit and a memory cell array of the invention.
Figure 4:
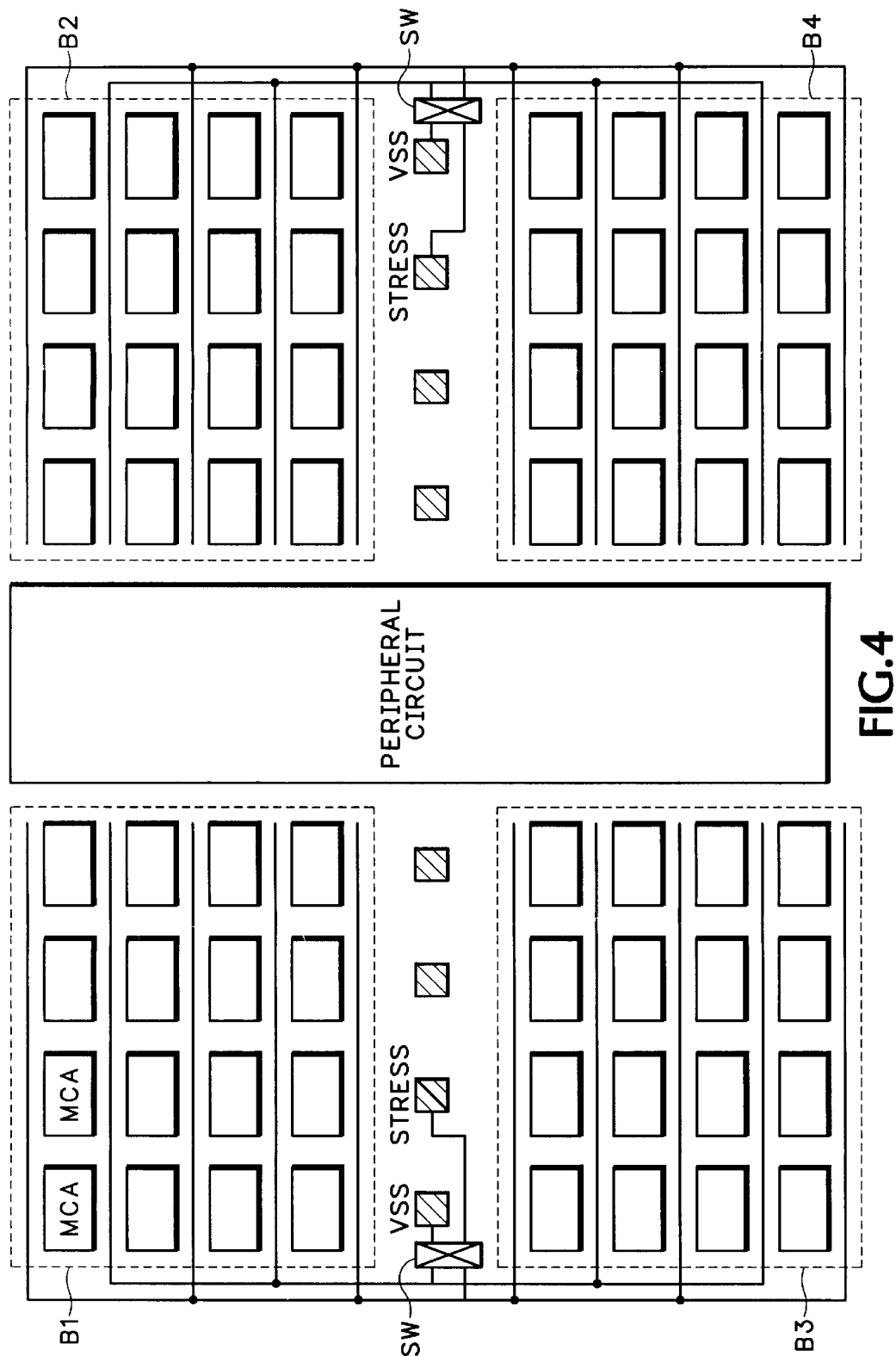
FIG. 4 schematically illustrates pads for supplying a stress voltage and a ground potential and a memory cell array according to the invention.

FIGS. 2–4 illustrate a circuit for performing a burn-in test while the memory device is still on the wafer.

As illustrated in FIG. 4, the entire chip is structured into a lead on chip (LOC). Four banks B1 to B4 having a plurality of sub memory cell arrays (MCA), which are made up of memory cells arranged in a row and column matrixes, are placed at four corners of the chip. The pads are arranged at the center of the chip. The peripheral circuits of each position are not described here, but only the parts related to the wafer burn-in (WBI) test will be described below.

It is hard to realize highly integrated chips employing a strapping structure using metals and polysilicon gates. As the density gets higher, the cell gets smaller thereby reducing the metal pitch so that the polysilicon and metal cannot be connected in the strap region. Therefore, to solve the problem, there is introduced a subword-line drive (SWD) structure. The structure needs a metal line only for each 4 word lines or 8 word lines thereby extending the intervals of metal. The invention therefore is applicable for a memory device having SWD structure rather than the conventional WBI structure.

VSS-C and VSS-T in FIG. 2 are used for the ground power source VSS of the SWD, during a normal operating mode, and discharge the word lines when they are disabled. The VSS-C and VSS-T respectively control each halved SWD. During normal operation, the same voltage VSS is applied to the word lines WL-C and WL-T from each outer power source pad VSS and STRESS via a switching part SW. When the circuit is in the wafer burn-in test mode, switch SW alternately applies a ground power source VSS (0V) and the stress voltage on the pads to word lines VSS_C and VSS_T, thereby testing the memory cells. The ground and stress potentials are applied externally of the circuit using the two pads VSS and STRESS.

The sub memory cell array MCA of FIG. 4 is illustrated in FIG. 3 in detail. FIG. 3 illustrates the sub memory cell array MCA and the sub word line driver SWD for driving the word lines. The MCA includes a plurality of storage node pairs for storing a bit and the complement thereof; a pair of bit lines BL and/BL for storing or accessing the bit and the complement thereof, respectively; and a pair of MOS transistors (not shown) controlled by the voltage applied to the WL. The thus-structured memory cell is the known one transistor-one one capacitor type. A sense amplifier SA connected to the pair of bit lines BL, /BL amplifies the voltages for storing data into or reading data out of the storage nodes.

SWD is controlled by a signal MWEi driven according to the predecoding operation of the row address predecoding signal, and by signals PX0(/PX0), PX1(/PX1), PX2(/PX2), PX3(/PX3) which are driven by subrow decoders. SWD is the VSS power line used in disabling the selected word line and non-selected word line during the normal operation. The VSS power line is made up with the VSS-C and VSS-T by each SWD area. Here, in case of the normal operation, the row address predecoding signal MWEi, which is from the main row decoder, is selected when VSS-C and VSS-T are 0V, and precharged to each node S0, S1, S2 and S3 of the SWD region (VCC-Vtn). One of the signals PX0, PX1, PX2 and PX3 is selected by the row address signal, which is not related to the signal MWEi, to thereby activate the word line.

When entering the WBI test mode as illustrated in FIGS. 2 and 3, the row address signal is disabled. Therefore, at the state that MWEi through MWEi and PX0 through PX3 become low level, and /PXO through /PX3, the inverted signals of PX0 through PX3, are at a high level, VSS-T and VSS-C power lines are alternately applied as the VSS or the stress voltage. When the VSS-C is the VSS and the VSS-T is the stress voltage, only the word line WL-T, which is connected to the true cell (being connected to BL) among the memory arrays, is enabled. On the other hand, when VSS-C is at the stress voltage and the VSS-T is the ground potential VSS, only a word line WL-C connected to the complement cell (associated with/BL) among the memory cell arrays, is enabled. The VSS power line of the subword-line driver SWD area maintains the word line for driving the transmission transistor of the cell connected to the same bit lines BL and /BL into the VSS.

The VSS relation between the memory cell and the subword-line driver SWD area is such that in case of the previously-described WBI test, either a word line connected to the true cell or a word line connected to the complement cell is driven, so that the storage node data connected to BL are always the same data, and the data of the storage connected to /BL are also the same data. Therefore, when the word line of the true cell and the word line of the complement cell are simultaneously activated, the data applied to the pair of bit lines BL, /BL are indistinct. Therefore, the stress is not applied to the process defect between the bit line BL and the complement bit line /BL in case of WBI. Therefore, the screening job is not available during WBI test. In addition, various process defects such as the pair of bit lines BL, /BL and storage node or the pair of bit lines BL, /BL and word line WL, are not screened.

Therefore, the characteristic of the invention is that there is provided the memory device having SWD structure, which connects one VSS power line connected to the SWD area to the word line of the cell connected to the same bit line BL, and also connects the other VSS power line to the word line of the cell connected to the other bit line/BL.

As described above, the wafer burn-in circuit according to the preferred embodiment of the invention can initially screen a minute defect of the semiconductor device, thereby guaranteeing long-term reliability. The invention is advantageous in that the stress is applied through the bit line as well as the word line. Additionally, the invention can reduce the production expenses of the memory chip.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A semiconductor memory device, comprising:

a memory cell array having a plurality of true cells and a plurality of corresponding complement cells;

a true cell word line associated with one of said true cells;

a complement cell word line associated with one of said complement cells;

a first subword line driver for driving said true cell word line during normal operation mode or test mode;

a second subword line driver for driving said complement cell word line during normal operation mode or test mode; and first and second power lines respectively connected to said first and second subword line drivers;

wherein during a test mode there is supplied to one of the first and second power lines a ground potential, and there is supplied to the other one of the first and second power lines a stress potential different from the ground potential.

2. A semiconductor memory device of claim 1:

wherein during said normal operation mode there is supplied to the first and second power lines a ground potential.

3. A semiconductor memory device, comprising:

a memory cell array having a plurality of true cells and a plurality of corresponding complement cells;

a true cell word line associated with one of said true cells;

a complement cell word line associated with one of said complement cells;

a first subword line driver for driving said true cell word line comprising a first enable means for enabling a word line and a first disable means for disabling said word line during a normal operation mode;

a second subword line driver for driving said complement cell word line comprising a second enable means for enabling a word line and a second disable means for disabling said word line during the normal operation mode; and first and second power lines respectively connected to said first and second subword line drivers;

a switching block connected to said first and second subword line drivers for, in response to one or more control signals, supplying to one of the true and complement cell word lines a ground potential through one of said power lines, and to the other one of the true and complement cell word lines a stress potential different from the ground potential through the other one of said power lines during a test mode;

wherein said true and complement cells are respectively connected to a bit line and a complement thereof which cross said true and complement cell word lines.

4. The semiconductor memory device of claim 3 wherein said one or more control signals are test mode signals.

5. A semiconductor memory device, comprising:

a memory cell array having a plurality of true cells and a plurality of corresponding complement cells;

a true cell word line associated with one of said true cells;

a complement cell word line associated with one of said complement cells;

a first subword line driver for driving said true cell word line comprising;

a first enable means for enabling a word line and a first disable means for disabling said word line during a normal operation mode;

a second subword line driver for driving said complement cell word line comprising a second enable means for enabling a word line and a second disable means for disabling said word line during the normal operation mode; and first and second power lines respectively connected to said first and second subword line drivers.

6. The semiconductor memory device of claim 5, wherein during said normal operation mode there is supplied to one of the first and second power lines a ground potential.

7. A semiconductor memory device, comprising:

a memory cell array having a plurality of memory cells;

a first word line associated with one of the memory cells;

a second word line associated with another one of the memory cells, said second word line being adjacent to said first word line;

a first subword line driver driving said first word line during normal operation mode;

a second subword line driver driving said second word line during normal operation mode; and first and second power lines respectively connected to said first and second subword line drivers;

wherein during a test mode there is supplied to one of the first and second power lines a ground potential, and there is supplied to the other one of the first and second power lines a stress potential different from the ground potential and wherein during said normal operation mode there is supplied to the first and second power lines a ground potential.

8. A semiconductor memory device, comprising:

a memory cell array having a plurality of memory cells;

a first word line associated with one of the memory cells;

a second word line associated with another one of the memory cells, said second word line being adjacent to said first word line;

a first subword line driver driving said first word line comprising a first enable means for enabling a word line and a first disable means for disabling said word line during a normal operation mode;

a second subword line driver driving said second word line comprising a second enable means for enabling a word line and a second disable means for disabling said word line during the normal operation mode;

first and second power lines respectively connected to said first and second subword line drivers;

a switching block connected to said first and second subword line drivers for, in response to one or more control signals, supplying to one of the first and second word lines a ground potential through one of said power lines, and to the other one of the first and second word lines a stress potential different from the ground potential through the other one of said power lines during a test mode;

wherein during said normal operation mode there is supplied to the first and second power lines a ground potential.

9. The semiconductor memory device of claim 8 wherein said one or more control signals are test mode signals.

10. A method for testing a semiconductor memory device having a plurality of true cells and a plurality of corresponding complement cells, and wherein said true cells and said complement cells are addressed responsive to a signal applied to associated true cell word lines and complement cell word lines respectively, said method comprising the steps of:

connecting either group of said true cell word lines and said complement cell word lines to a ground potential through a first subword line driver comprising a first enable means for enabling a word line and a first disable means for disabling said word line during a normal operation mode or a second subword line driver comprising a second enable means for enabling a word line and a second disable means for disabling said word line during the normal operation mode;

connecting the other group of said true cell word lines and said complement cell word lines to a stress potential different from the ground potential through the first subword line driver or the second subword line driver.

* * * * *